United States Patent
Yiu et al.

(10) Patent No.: US 10,157,875 B2
(45) Date of Patent: Dec. 18, 2018

(54) CHIP PACKAGE AND METHOD FOR FORMING THE SAME

(71) Applicant: XINTEC INC., Taoyuan (TW)

(72) Inventors: Ho-Yin Yiu, Hong Kong (CN); Ying-Nan Wen, Hsinchu (TW); Chien-Hung Liu, New Taipei (TW); Wei-Chung Yang, Taoyuan (TW)

(73) Assignee: XINTEC INC., Taoyuan (TW)

( * ) Notice: Subject to any disclaimer, the term of this patent is extended or adjusted under 35 U.S.C. 154(b) by 91 days.

(21) Appl. No.: 14/709,216

(22) Filed: May 11, 2015

(65) Prior Publication Data

US 2015/0325557 A1 Nov. 12, 2015

(30) Foreign Application Priority Data

May 12, 2014 (TW) .............................. 103116670 A
Apr. 21, 2015 (TW) .............................. 104112639 A

(51) Int. Cl.
*H01L 23/00* (2006.01)
*H01L 25/16* (2006.01)
(Continued)

(52) U.S. Cl.
CPC .............. *H01L 24/19* (2013.01); *H01L 21/56* (2013.01); *H01L 23/3114* (2013.01); *H01L 23/3157* (2013.01); *H01L 23/5226* (2013.01); *H01L 24/08* (2013.01); *H01L 24/17* (2013.01); *H01L 24/20* (2013.01); *H01L 24/81* (2013.01); *H01L 24/94* (2013.01); *H01L 24/97* (2013.01);
*H01L 25/16* (2013.01); *H01L 27/14618* (2013.01); *H01L 27/14634* (2013.01);
(Continued)

(58) Field of Classification Search
CPC ... B81C 1/0023; H01L 24/19; H01L 23/5226; H01L 2225/06541; H01L 24/73; H01L 27/14618
See application file for complete search history.

(56) References Cited

U.S. PATENT DOCUMENTS

2008/0308928 A1* 12/2008 Chang ................. H01L 25/0657
257/723
2009/0014858 A1* 1/2009 Boon ................... H01L 21/4853
257/686
(Continued)

FOREIGN PATENT DOCUMENTS

TW 200828564 7/2008
TW 201125097 7/2011
(Continued)

*Primary Examiner* — Thao X Le
*Assistant Examiner* — Laura Dykes
(74) *Attorney, Agent, or Firm* — Liu & Liu

(57) ABSTRACT

A chip package including a first substrate is provided. The first substrate includes a sensing device. A second substrate is attached onto the first substrate and includes an integrated circuit device. A first conductive structure is electrically connected to the sensing device and the integrated circuit device through a redistribution layer disposed on the first substrate. An insulating layer covers the first substrate, the second substrate and the redistribution layer. The insulating layer has a hole therein and a second conductive structure is disposed under the bottom of the hole. A method for forming the chip package is also provided.

34 Claims, 14 Drawing Sheets

(51) Int. Cl.
*H01L 23/522* (2006.01)
*H01L 23/31* (2006.01)
*H01L 21/56* (2006.01)
*H01L 27/146* (2006.01)
*H01L 25/00* (2006.01)

(52) U.S. Cl.
CPC .............. *H01L 24/73* (2013.01); *H01L 25/50* (2013.01); *H01L 2224/0235* (2013.01); *H01L 2224/02372* (2013.01); *H01L 2224/0401* (2013.01); *H01L 2224/04042* (2013.01); *H01L 2224/04073* (2013.01); *H01L 2224/04105* (2013.01); *H01L 2224/05548* (2013.01); *H01L 2224/12105* (2013.01); *H01L 2224/13024* (2013.01); *H01L 2224/13144* (2013.01); *H01L 2224/1403* (2013.01); *H01L 2224/16145* (2013.01); *H01L 2224/16146* (2013.01); *H01L 2224/16225* (2013.01); *H01L 2224/32145* (2013.01); *H01L 2224/48091* (2013.01); *H01L 2224/48145* (2013.01); *H01L 2224/48465* (2013.01); *H01L 2224/73209* (2013.01); *H01L 2224/73215* (2013.01); *H01L 2224/73217* (2013.01); *H01L 2224/73227* (2013.01); *H01L 2224/73265* (2013.01); *H01L 2224/73267* (2013.01); *H01L 2224/94* (2013.01); *H01L 2224/97* (2013.01); *H01L 2225/06506* (2013.01); *H01L 2225/06513* (2013.01); *H01L 2225/06568* (2013.01); *H01L 2924/141* (2013.01); *H01L 2924/143* (2013.01); *H01L 2924/146* (2013.01); *H01L 2924/1433* (2013.01); *H01L 2924/181* (2013.01); *H01L 2924/19107* (2013.01)

(56) References Cited

U.S. PATENT DOCUMENTS

| | | | |
|---|---|---|---|
| 2009/0170241 A1* | 7/2009 | Shim | H01L 21/568 438/107 |
| 2009/0261466 A1* | 10/2009 | Pagaila | H01L 21/6835 257/686 |
| 2009/0309212 A1 | 12/2009 | Shim et al. | |
| 2010/0032830 A1* | 2/2010 | Chang | H01L 21/76898 257/737 |
| 2011/0278736 A1* | 11/2011 | Lin | H01L 25/50 257/774 |
| 2013/0020665 A1* | 1/2013 | Oganesian | H01L 27/14618 257/432 |
| 2015/0259194 A1* | 9/2015 | Lin | B81B 7/007 257/773 |
| 2015/0325551 A1* | 11/2015 | Wen | B81B 7/02 257/738 |
| 2015/0325557 A1* | 11/2015 | Yiu | H01L 23/3114 257/414 |

FOREIGN PATENT DOCUMENTS

| | | |
|---|---|---|
| TW | 201140792 | 11/2011 |
| TW | 201320266 | 5/2013 |

* cited by examiner

# CHIP PACKAGE AND METHOD FOR FORMING THE SAME

CROSS REFERENCE TO RELATED APPLICATIONS

This Application is based on, and claims priority of Taiwan Patent Application No. 103116670, filed on May 12, 2014, and priority of Taiwan Patent Application No. 104112639, filed on Apr. 21, 2015, the entirety of which is incorporated by reference herein.

BACKGROUND OF THE INVENTION

Field of the Invention

The invention relates to chip package technology, and in particular to a chip package and methods for forming the same.

Description of the Related Art

The chip packaging process is an important step in the fabrication of an electronic product. Chip packages not only protect the chips therein from outer environmental contaminants, but they also provide electrical connection paths between the electronic elements inside and those outside of the chip packages.

In general, chip packages having a sensing function and other integrated circuit chips are separately and independently disposed on a printed circuit board and are electrically connected to each other through wires.

However, the size of the printed circuit board is limited by this fabrication process. As a result, it is difficult to further decrease the size of the electronic products made therefrom.

Thus, there exists a need in the art for development of a chip package and methods for forming the same capable of mitigating or eliminating the aforementioned problems.

BRIEF SUMMARY OF THE INVENTION

An embodiment of the invention provides a chip package comprising a first substrate. The first substrate comprises a sensing device. A second substrate is attached onto the first substrate, wherein the second substrate comprises an integrated circuit device. A first conducting structure is electrically connected to the sensing device and the integrated circuit device through a redistribution layer disposed on the first substrate. An insulating layer covers the first substrate, the second substrate and the redistribution layer, wherein the insulating layer has a hole therein. A second conducting structure is disposed under the bottom of the hole.

An embodiment of the invention provides a method for forming a chip package comprising providing a first substrate, wherein the first substrate comprises a sensing device. A second substrate is attached onto the first substrate, wherein the second substrate comprises an integrated circuit device. A first conducting structure is formed to electrically connect to the sensing device and the integrated circuit device through a redistribution layer located on the first substrate. A second conducting structure and an insulating layer are formed. The insulating layer covers the first substrate, the second substrate and the redistribution layer, and the insulating layer has a hole therein. The second conducting structure is located under the bottom of the hole.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, fingerprint-recognition devices, microactuators, surface acoustic wave devices, pressure sensors, ink printer heads, and so on.

The above-mentioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the above-mentioned wafer-level packaging process may also be adapted to form a chip package having multilayer integrated circuit devices by stacking a plurality of wafers having integrated circuits or to form a system-in-package (SIP).

Figure 1A:
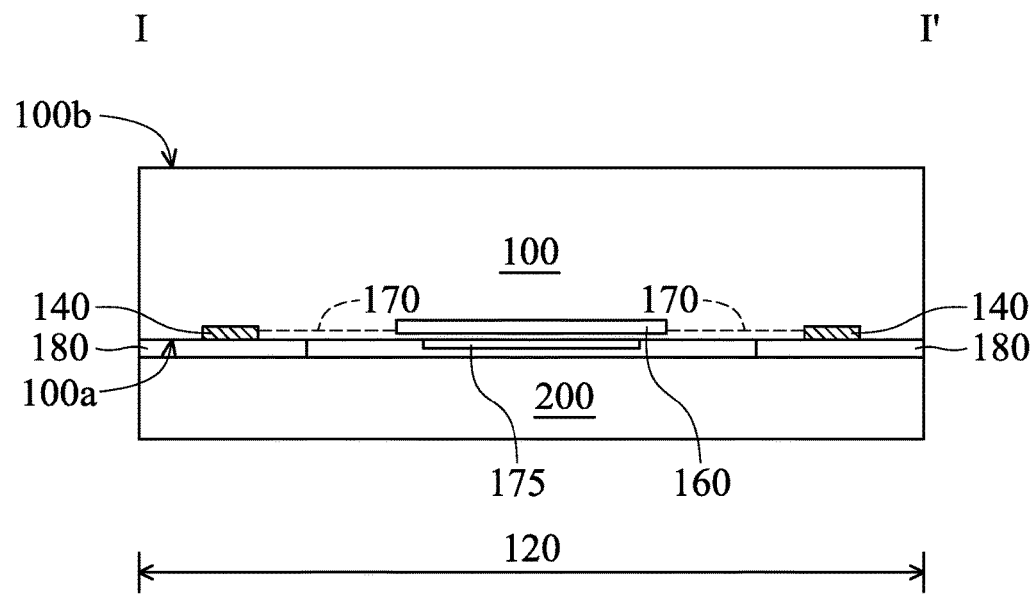
FIGS. 1A to 1F are cross-sectional views of an exemplary embodiment of a method for forming a chip package according to the invention.
Figure 1B:
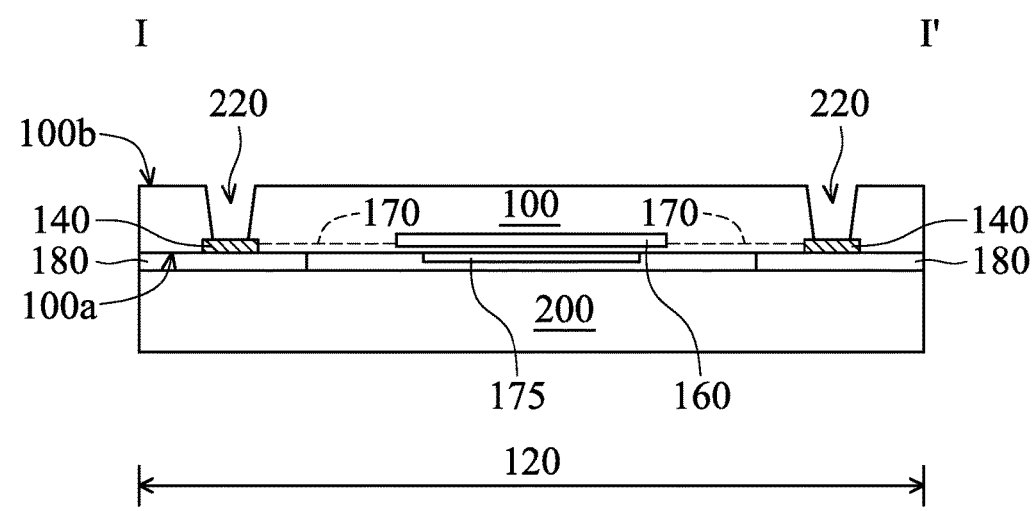
Figure 1C:
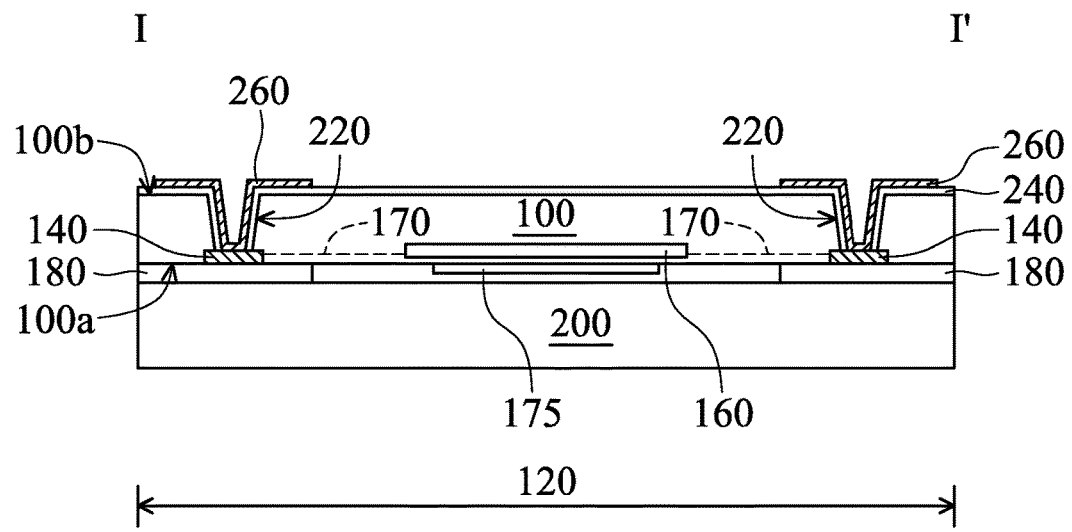
Figure 1D:
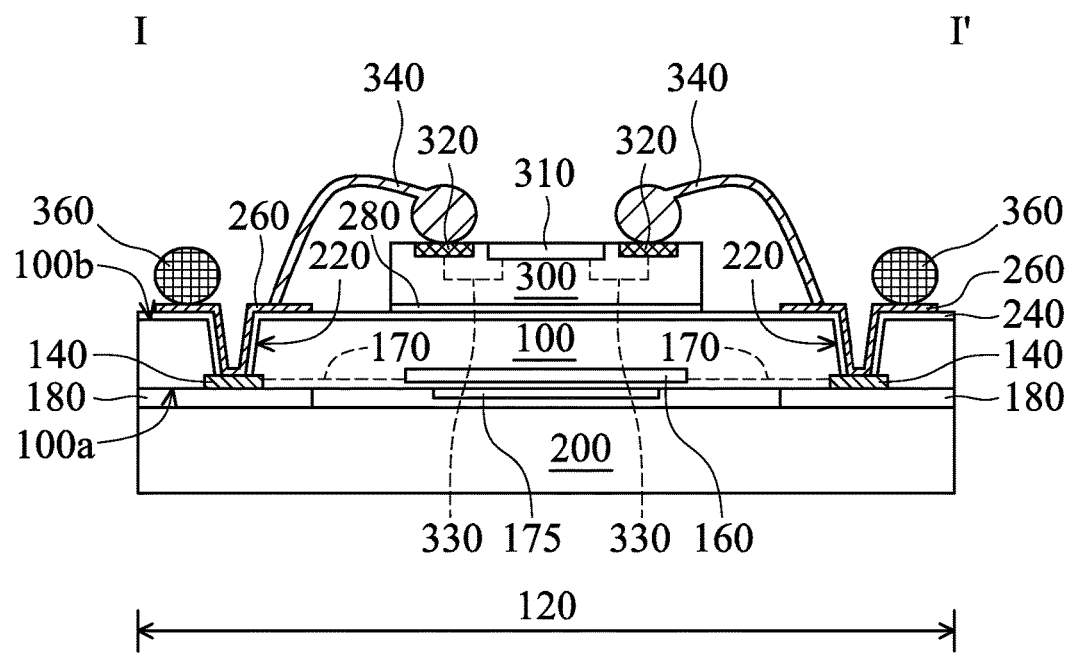
Figure 1E:
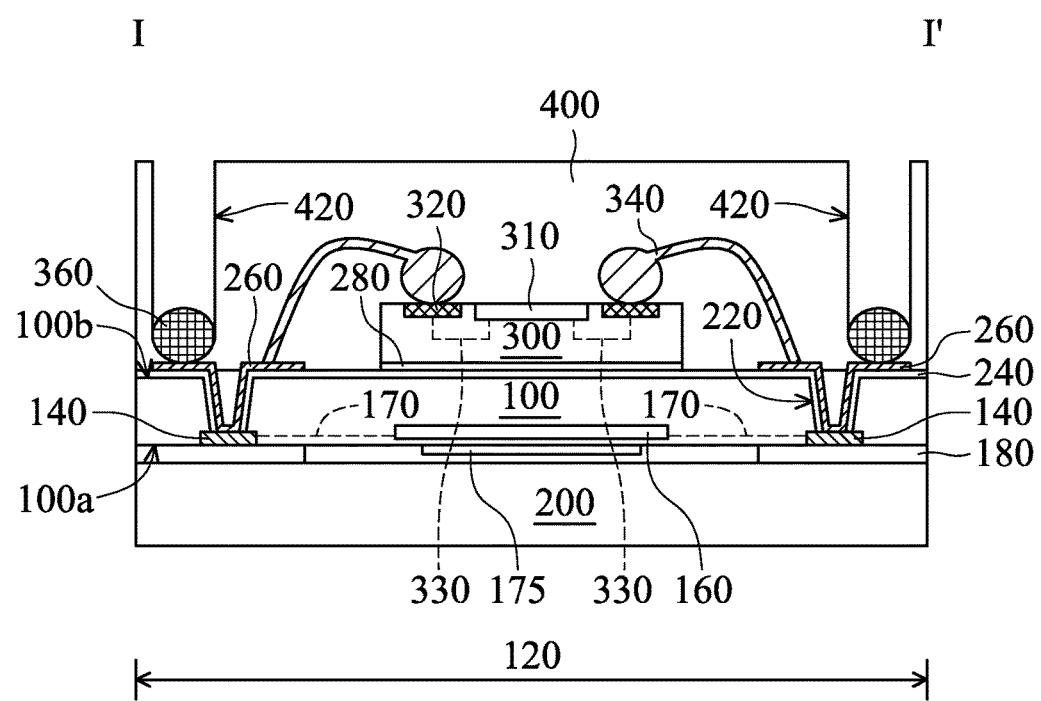
Figure 1F:
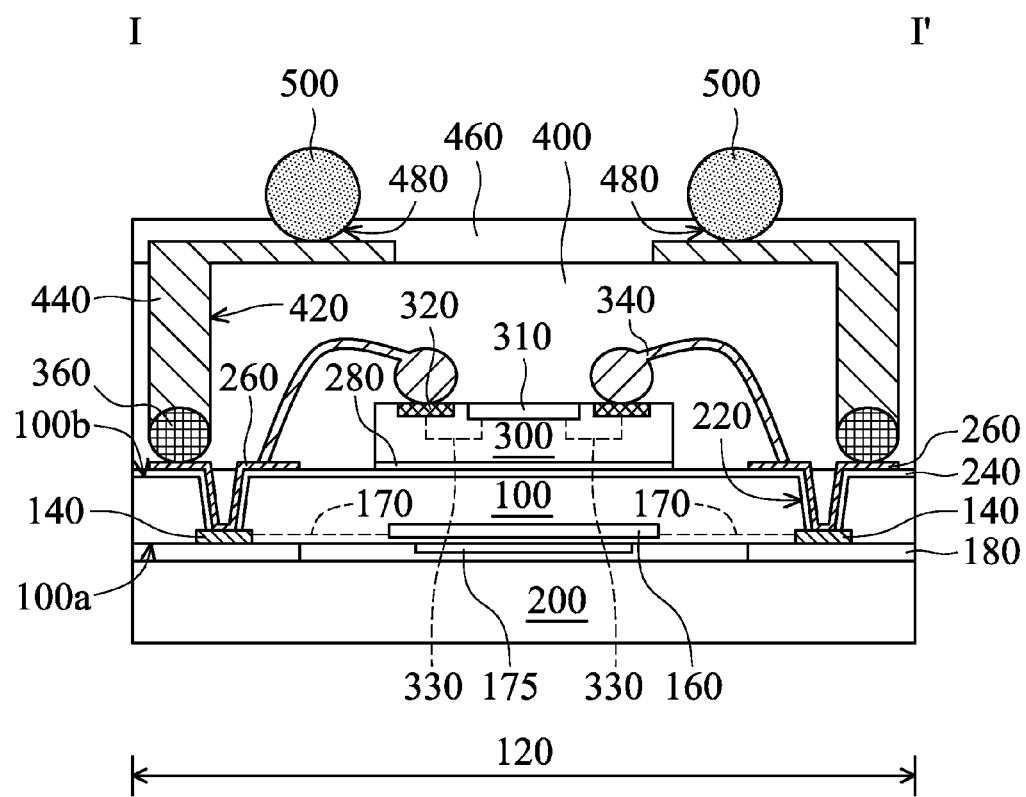
Figure 2:
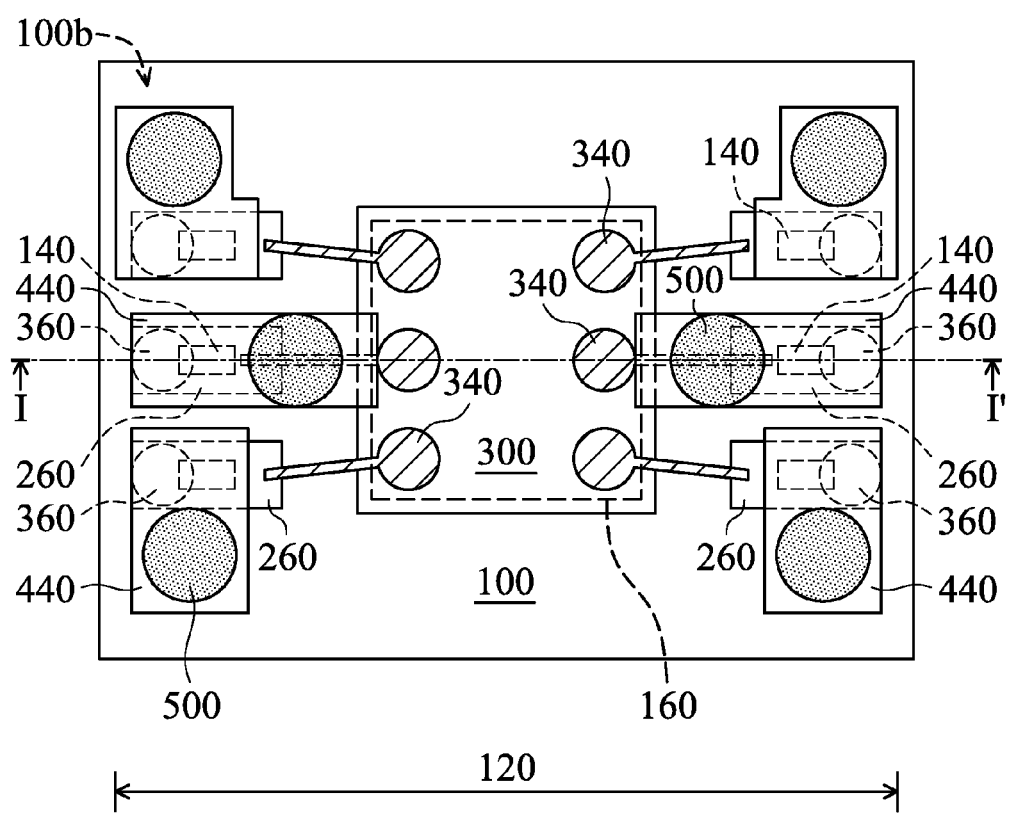
FIG. 2 is a top view of an exemplary embodiment of a chip package according to the invention.

A cross-sectional view and a top view of an exemplary embodiment of a chip package according to the invention are illustrated in FIGS. 1F and 2, wherein FIG. 1F is a cross-sectional view along the line I-I' in FIG. 2. In the embodiment, the chip package comprises a first substrate 100, a second substrate 300, and a plurality of first conducting structures 340. The first substrate 100 has a first surface 100a and a second surface 100b opposite to the first surface 100a. In one embodiment, the first substrate 100 may be a silicon substrate or another semiconductor substrate.

In the embodiment, the first substrate 100 comprises a sensing device 160 and one or more conducting pads 140. The sensing device 160 and the conducting pads 140 may be adjacent to the first surface 100a of the first substrate 100. In one embodiment, the conducting pads 140 may be a single conducting layer or comprise multiple conducting layers. To simplify the diagram, only six conducting pads 140 comprising a single conducting layer are depicted in FIGS. 1F and 2 as an example. In the embodiment, the first substrate 100 further comprises a plurality of first openings 220. The first openings 220 extend from the second surface 100b towards the first surface 100a and correspondingly expose the conducting pads 140.

In one embodiment, the sensing device 160 comprises an image-sensing element, such as a complementary metal-oxide-semiconductor image sensor (CIS) element, and an optical element 175 is disposed on the first surface 100a and corresponds to the sensing device 160. The optical element 175 may comprise color filters and micro-lens or another suitable optical element. In another embodiment, the sensing device 160 is configured to sense biometrics, and may comprise a fingerprint-recognition element. In yet another embodiment, the sensing device 160 is configured to sense environmental characteristics, and may comprise a temperature-sensing element, a humidity-sensing element, a pressure-sensing element, a capacitance-sensing element, or another suitable sensing element. In one embodiment, the sensing element in the sensing device 160 may be electrically connected to the conducting pads 140 through an interconnection structure which may comprise dielectric layers, contacts, metal wires and vias (not shown) in the first substrate 100. To simplify the diagram, dotted lines 170 are used herein to depict interconnection structures between the sensing device 160 and the conducting pads 140.

A cover plate 200 is attached on the first surface 100a of the first substrate 100 through a spacer layer (or dam) 180. The spacer layer 180 covers the conducting pads 140 and exposes the sensing device 160 and the optical element 175. The cover plate 200 protects the exposed sensing device 160 and optical element 175.

In an embodiment, the spacer layer 180 does not substantially absorb moisture. In an embodiment, the spacer layer 180 may be non-adhesive, and the cover plate 200 is attached on the first substrate 100 through the spacer layer 180 and an additional adhesive layer. In another embodiment, the spacer layer 180 may itself be adhesive and may contact none of adhesion glue, thereby assuring that the spacer layer 180 will not move due to the disposition of the adhesion glue. Furthermore, since the adhesion glue is not needed, the sensing device 160 can be prevented from being contaminated by an overflow of the adhesion glue. In the embodiment, the spacer layer 180 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates), a photoresist material or another suitable insulating material. Moreover, the cover plate 200 may comprise glass, sapphire or another suitable protective material.

An insulating layer 240 is conformally disposed on the second surface 100b of the first substrate 100, extends into the first openings 220 in the first substrate 100, and exposes a portion of each conducting pad 140. In the embodiment, the insulating layer 240 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

A patterned redistribution layer (RDL) 260 is disposed on the insulating layer 240 and conformally extends to the sidewalls and the bottoms of the first openings 220. The redistribution layer 260 is electrically connected to the conducting pads 140 by directly or indirectly contacting the exposed conducting pads 140 through the first openings 220. The redistribution layer 260 is electrically isolated from the first substrate 100 by the insulating layer 240. As a result, the redistribution layer 260 in the first opening 220 is also referred to as a through silicon via (TSV). In one embodiment, the redistribution layer 260 may comprise copper, aluminum, gold, platinum, nickel, tin, a combination thereof, a conductive polymer material, a conductive ceramic material (such as indium tin oxide or indium zinc oxide), or another suitable conductive material.

In another embodiment, the first openings 220 may at least penetrate the conducting pads 140, such that the redistribution layer 260 may directly contact the inner of the conducting pads 140. This redistribution layer 260 electrically connected to the conducting pads 140 is referred to as a ring-contact.

The second substrate 300 may be attached onto the insulating layer 240 on the second surface 100b through an adhesive layer, such as adhesive glue, 280. In the embodiment, the second substrate 300 comprises an integrated circuit device 310. Moreover, the integrated circuit device 310 may comprise a signal processor, such as an image signal processor (ISP) or another application-specific integrated circuit (ASIC).

In the embodiment, the second substrate 300 may comprise one or more conducting pads 320. The conducting pads 320 may be adjacent to the upper surface of the second substrate 300 (i.e. the surface opposite to the second surface 100b). Similarly, the conducting pads 320 may be a single conducting layer or comprise multiple conducting layers. To simplify the diagram, only a single conducting layer is depicted herein as an example. In one embodiment, the conducting pads 320 may be electrically connected to the integrated circuit element in the integrated circuit device 310 through an interconnection structure in the second substrate 300. To simplify the diagram, dotted lines 330 are used herein to depict interconnection structures between the integrated circuit device 310 and the conducting pads 320.

In the embodiment, the size of the first substrate 100 is greater than that of the second substrate 300. Moreover, when the size of the first substrate 100 is large enough, more than one second substrate 300, each having different integrated circuit functions, can be disposed on the second surface 100b of the first substrate 100. In the embodiment, the second substrate 300 completely vertically overlaps the sensing device 160 of the first substrate 100. In other embodiments, the second substrate 300 may partially vertically overlap the sensing device 160 of the first substrate 100 or may not vertically overlap the sensing device 160 of the first substrate 100.

The first conducting structures 340 are correspondingly disposed on the redistribution layer 260 and the conducting pads 140. The first conducting structures 340 are electrically connected to the sensing device 160 through the redistribution layer 260 and the conducting pads 140, and are electrically connected to the integrated circuit device 310 through the conducting pads 320. Therefore, the first conducting structures 340 electrically connect the sensing device 160 to the integrated circuit device 310. In one embodiment, each of the first conducting structures 340 is formed of a bonding ball on the conducting pad 320 and a wire extending from the bonding ball to the redistribution layer 260. Moreover, the first conducting structures 340 may comprise gold or another suitable conductive material.

In the embodiment, the chip package further comprises a plurality of second conducting structures 360, an insulating layer 400, a patterned metal layer 440, a passivation layer 460 and a plurality of third conducting structures 500 disposed on the second surface 100b of the first substrate 100. The second conducting structures 360 are correspondingly disposed on the redistribution layer 260 and are electrically connected to the corresponding conducting pads 140. In the embodiment, each of the second conducting structures 360 is formed of a bonding ball and may comprise gold or another suitable conductive material. In one embodiment, the material of the second conducting structures 360 is the same as the material of the first conducting structures 340.

The insulating layer 400 covers the second substrate 300, the insulating layer 240, the redistribution layer 260, and the first conducting structures 340. The insulating layer 400 has a plurality of holes 420 exposing the corresponding second conducting structures 360. Namely, the second conducting structures 360 are disposed under the bottoms of the holes 420. In the embodiment, the insulating layer 400 does not fill in the first openings 220 of the first substrate 100. In other embodiments, the insulating layer 400 may partially or fully fill the first openings 220 of the first substrate 100. In the embodiment, the insulating layer 400 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

The patterned metal layer 440 is disposed on the insulating layer 400 and fills the holes 420 in the insulating layer 400 so as to be electrically connected to the exposed second conducting structures 360 through the holes 420. In one embodiment, the metal layer 440 fully fills the holes 420 in the insulating layer 400. In other embodiments, the metal layer 440 may be conformally disposed on the sidewalls and the bottoms of the holes 420 without fully filling the holes 420 in the insulating layer 400. In one embodiment, the metal layer 440 may comprise copper, aluminum, gold, platinum, nickel, tin, a combination thereof or another suitable conductive material.

The passivation layer 460 is disposed on the metal layer 440 and the insulating layer 400 and has a plurality of second openings 480 exposing portions of the metal layer 440 on the insulating layer 400. In the embodiment, the passivation layer 460 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), a photoresist material or another suitable insulating material.

The third conducting structures 500 are correspondingly disposed in the second openings 480 of the passivation layer 460. The third conducting structures 500 directly contact the exposed metal layer 440 and are electrically connected thereto. In the embodiment, the third conducting structures 500 do not overlap the second substrate 300, as shown in FIG. 2. In another embodiment, the third conducting structures 500 may overlap the second substrate 300. In other embodiments, the third conducting structures 500 may be arranged in an array so as to provide stable bonding in the subsequent process. It should be realized that the positions of the first conducting structures 340, the second conducting structures 360 and the third conducting structures 500 are determined by design requirements and they are not limited thereto.

In the embodiment, each of the third conducting structures 500 is a bump, such as a bonding ball or a conducting pillar, or may be another suitable conducting structure. The third conducting structure 500 may comprise tin, lead, copper, gold, nickel, a combination thereof or another suitable conductive material. For example, the third conducting structure 500 may be a solder ball. In the embodiment, the second conducting structures 360 and the third conducting structures 500 are bonding balls and the size of the third conducting structures 500 is greater than the size of the second conducting structures 360. In one embodiment, the material of the third conducting structures 500 is different from the material of the second conducting structures 360.

Figure 3A:
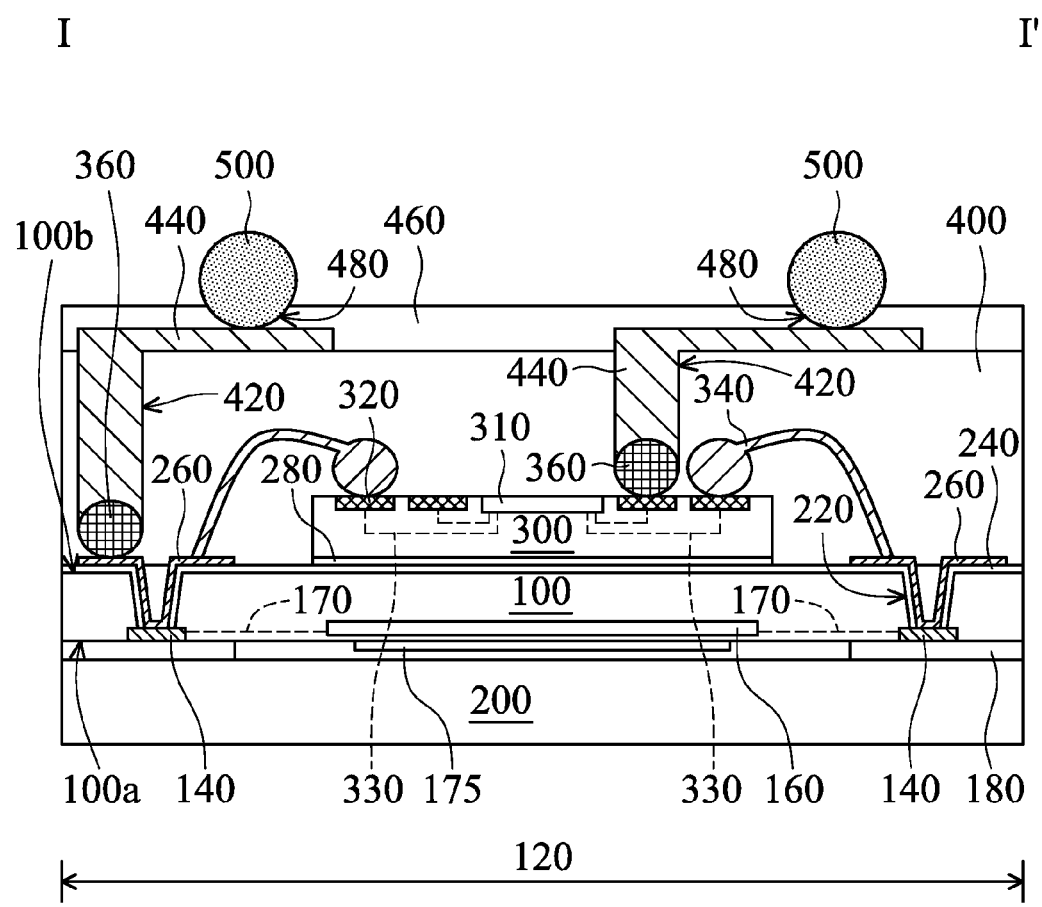
FIGS. 3A and 3B are a cross-sectional view and a top view of another exemplary embodiment of a chip package according to the invention.
Figure 3B:
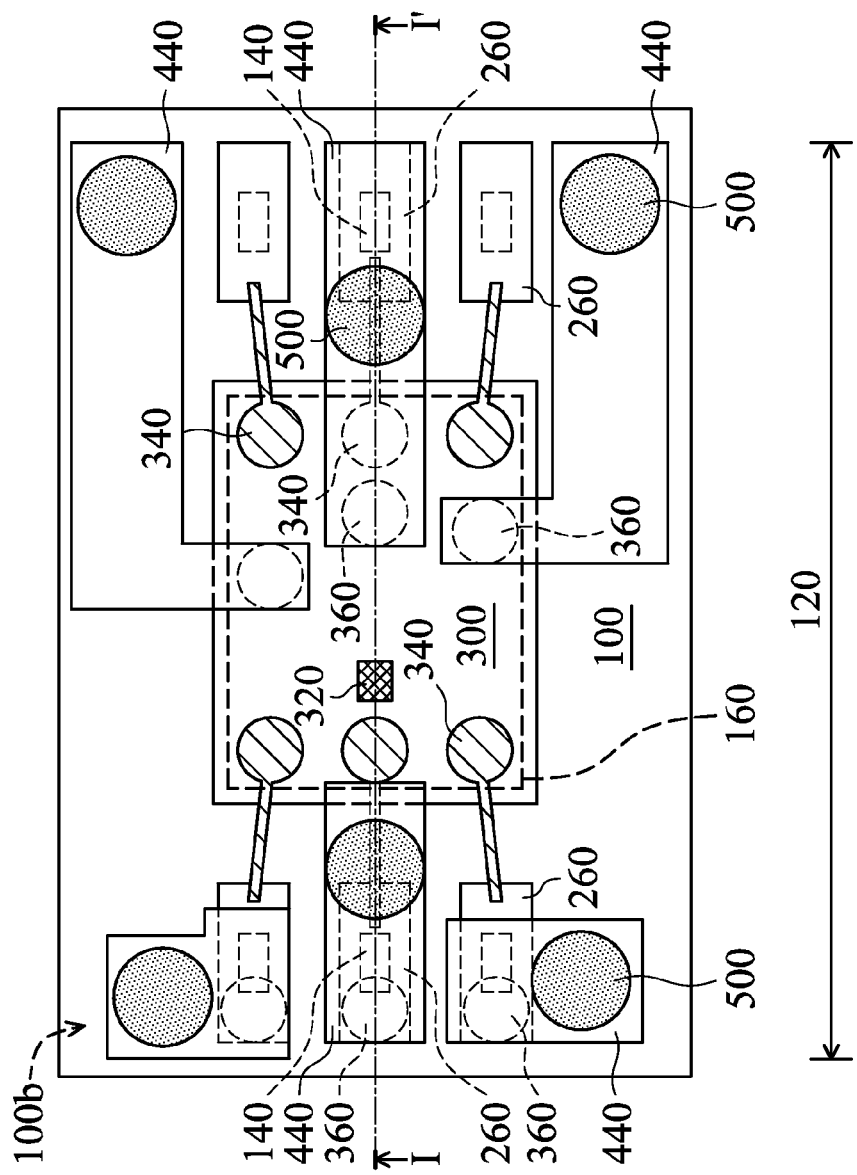

A cross-sectional view and a top view of another exemplary embodiment of a chip package according to the invention are illustrated in FIGS. 3A and 3B, wherein elements in FIGS. 3A and 3B that are the same as those in FIG. 1F and 2 are labeled with the same reference numbers as in FIGS. 1F and 2 and are not described again for brevity. The chip package structure shown in FIGS. 3A and 3B is similar to that shown in FIGS. 1F and 2. In FIG. 1F, both two second conducting structures 360 are disposed on the first substrate 100 as viewed from a cross-sectional view perspective. The two second conducting structures 360 are correspondingly electrically connected to the two conducting pads 320 through the redistribution layer 260 and the first conducting structures 340. In FIG. 3A, one second conducting structure 360 is disposed on the first substrate 100 and is electrically connected to the corresponding conducting pad 320 through the redistribution layer 260 and the first conducting structure 340. The other second conducting structure 360 is disposed on the second substrate 300 and directly on the corresponding conducting pad 320 so as to be directly or indirectly electrically connected to the corresponding conducting pad 320. Therefore, one of the holes 420 exposing the second conducting structures 360 vertically overlaps one of the conducting pads 320. In other embodiments, more than one second conducting structures 360 are disposed on the second substrate 300 and all directly on the corresponding conducting pads 320 so as to be electrically connected thereto. Therefore, more than one of the holes 420 exposing the second conducting structures 360 vertically overlap more than one of the conducting pads 320.

Moreover, as viewed from a top view perspective, all of the second conducting structures 360 in FIG. 2 are disposed outside of the second substrate 300. In FIG. 3, some of the second conducting structures 360 are disposed outside of the second substrate 300 while other second conducting structures 360 are disposed on the second substrate 300 and vertically overlap the second substrate 300. In other embodiments, all of the second conducting structures 360 may be disposed on the second substrate 300 and vertically overlap the second substrate 300.

Figure 4A:
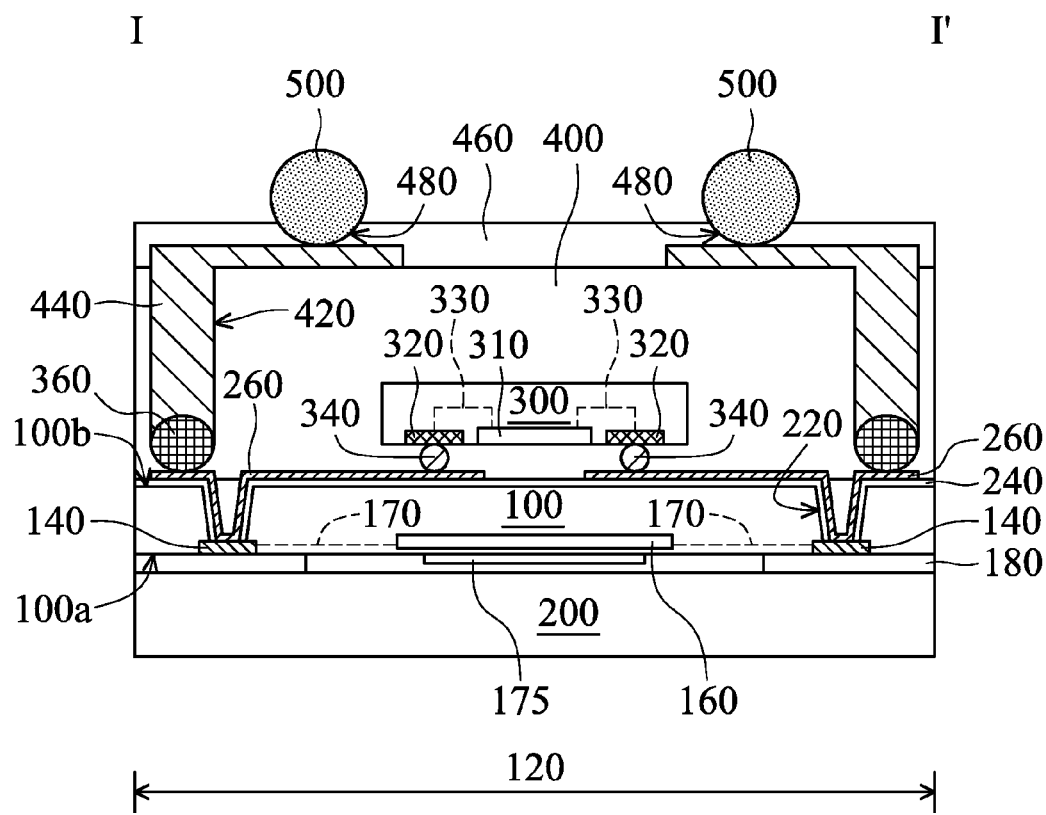
FIGS. 4A and 4B are a cross-sectional view and a top view of yet another exemplary embodiment of a chip package according to the invention.
Figure 4B:
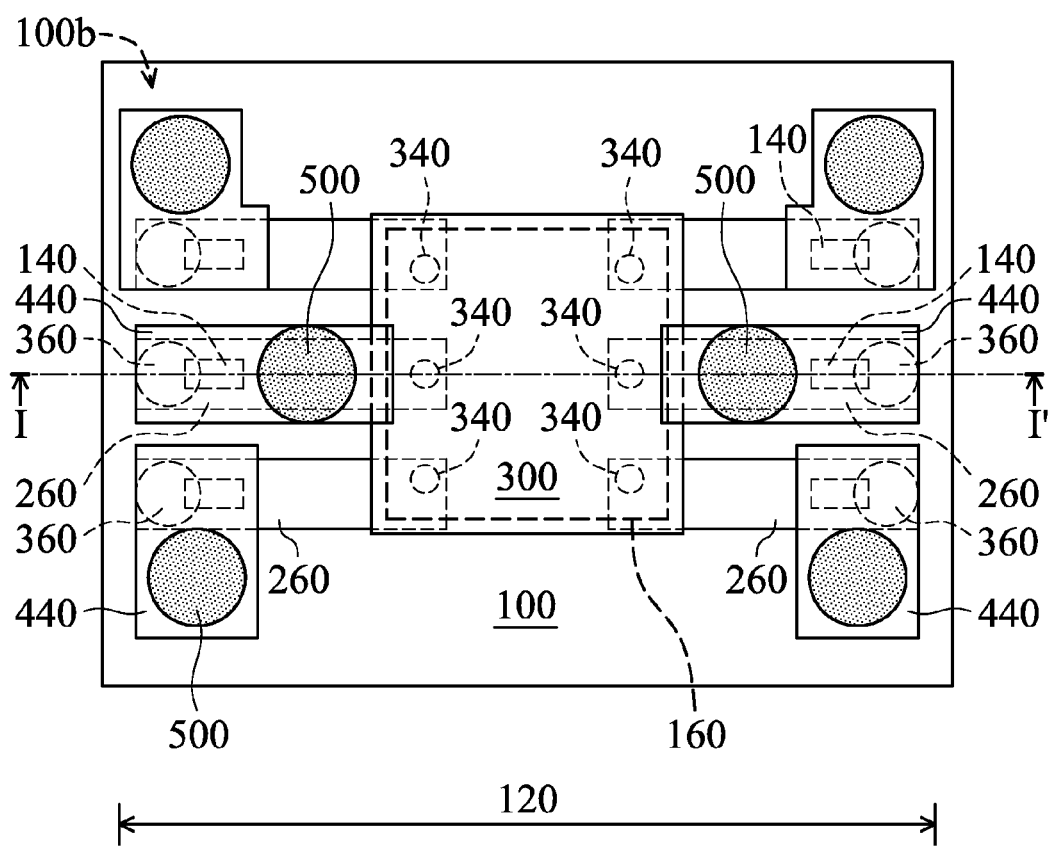

A cross-sectional view and a top view of yet another exemplary embodiment of a chip package according to the invention are illustrated in FIGS. 4A and 4B, wherein elements in FIGS. 4A and 4B that are the same as those in FIGS. 1F and 2 are labeled with the same reference numbers as in FIGS. 1F and 2 and are not described again for brevity. The chip package structure shown in FIGS. 4A and 4B is similar to that shown in FIGS. 1F and 2. In FIG. 1F, the second substrate 300 is attached onto the second surface 100b of the first substrate 100 through the adhesive layer 280 as viewed from a cross-sectional view perspective. As a result, the conducting pads 320 face away from the second surface 100b of the first substrate 100. The first conducting structures 340 are disposed on the conducting pads 320 and correspondingly extend onto the redistribution layer 260. In this case, the first conducting structures 340 are formed of a bonding ball and a wire. In FIG. 4A, the redistribution layer 260 further extends between the second substrate 300 and the second surface 100b of the first substrate 100, and the second substrate 300 is bonded to the redistribution layer 260 through the first conducting structures 340. As a result, the conducting pads 320 face the second surface 100b of the first substrate 100. In this case, the first conducting structures 340 are bumps, such as bonding balls or conducting pillars. In one embodiment, the first conducting structures 340, the second conducting structures 360 and the third conducting structures 500 are bonding balls. Moreover, the size of the second conducting structures 360 is less than the size of the third conducting structures 500 and greater than the size of the first conducting structures 340.

Moreover, as viewed from a top view perspective, the redistribution layer 260 in FIG. 2 is disposed outside of the second substrate 300. The first conducting structures 340 are disposed on the second substrate 300 and extend onto the redistribution layer 260. In FIG. 4B, the redistribution layer 260 extends under the second substrate 300. The first conducting structures 340 are disposed under the second substrate 300 and completely vertically overlap the second substrate 300. It should be realized that the positions of the redistribution layer 260, the first conducting structures 340, the second conducting structures 360, and the third conducting structures 500 are shown in figures as an example. They are determined by design requirements and are not limited thereto.

A chip package having a sensing function usually comprises a sensing device and conducting pads on the active surface of the chip package. The sensing device on the active surface needs to be prevented from being covered. Electrical connection paths cannot be formed between the active surface and the opposite inactive surface by a wire bonding process. Therefore, chip packages having a sensing function and other integrated circuit chips are separately and independently disposed on a printed circuit board and are electrically connected to each other through wires.

According to the aforementioned embodiments, TSVs formed of the redistribution layer 260 are electrically connected to the conducting pads 140 and the sensing device 160. The second substrate 300 is disposed on the second surface 100b of the first substrate 100, such that the sensing device 160 adjacent to the first surface 100a of the first substrate 100 can be prevented from being covered. The sensing device 160 in the first substrate 100 can be electrically connected to the integrated circuit device 310 in the second substrate 300 through the first conducting structures, such as wires, 340. Therefore, according to the embodiments, one sensing device and one or more than one integrated circuit devices can be integrated in the same chip package. As a result, the size of the printed circuit board, which is subsequently bonded to the chip package, can be reduced, thereby further decreasing the size of the electronic products made using the chip package having a sensing function.

Chip packages comprising a front side illumination (FSI) image-sensing element are shown in FIGS. 1F, 2, 3A, 3B, 4A and 4B as examples. However, the invention can be implemented in other chip packages, such as chip packages comprising back side illumination (BSI) image-sensing elements or other chip packages having different functions.

Figure 5A:
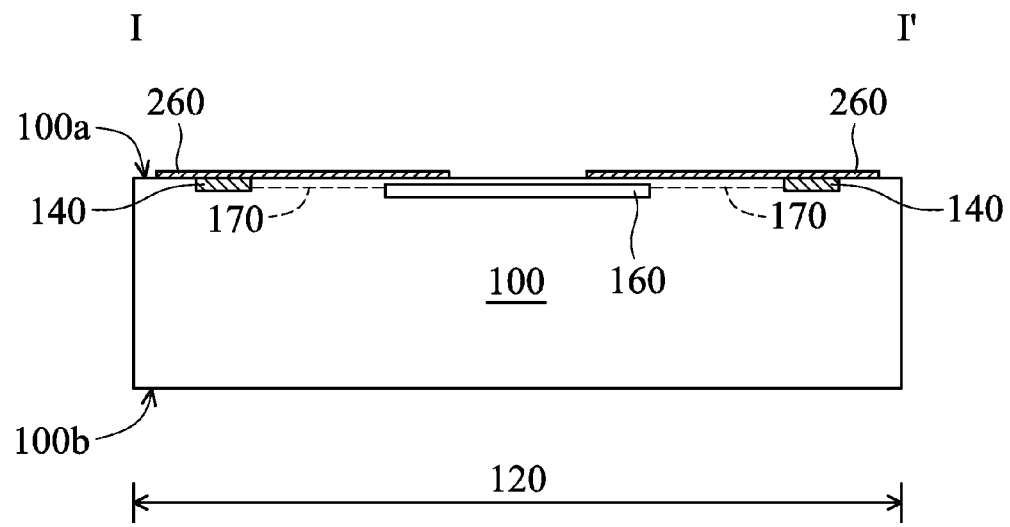
FIGS. 5A to 5F are cross-sectional views of another exemplary embodiment of a method for forming a chip package according to the invention.
Figure 5B:
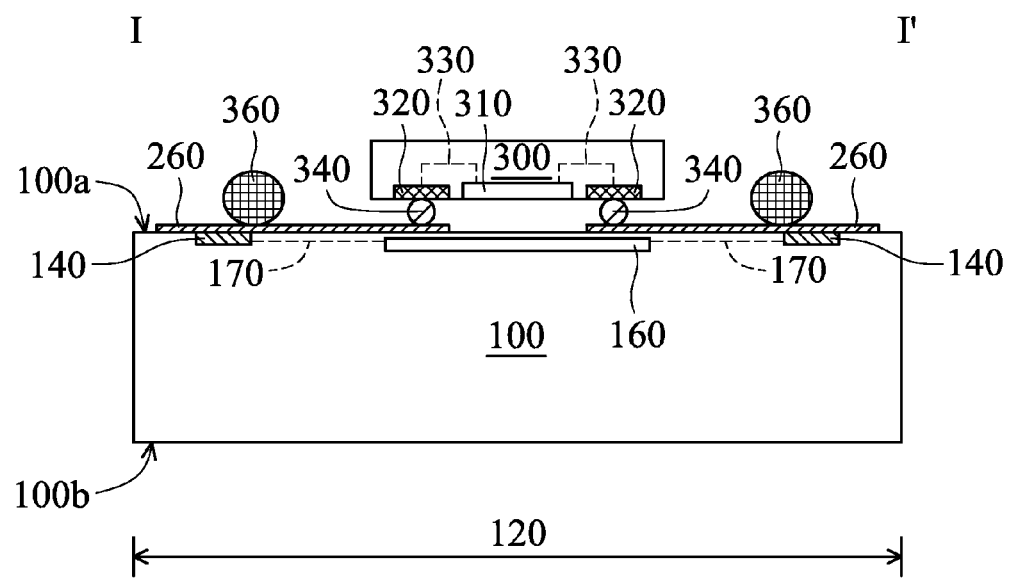
Figure 5C:
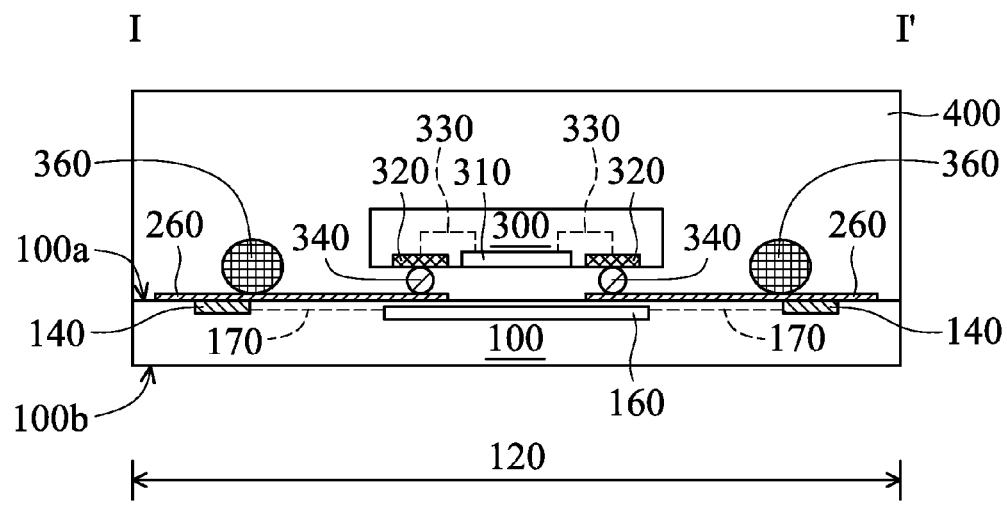
Figure 5D:
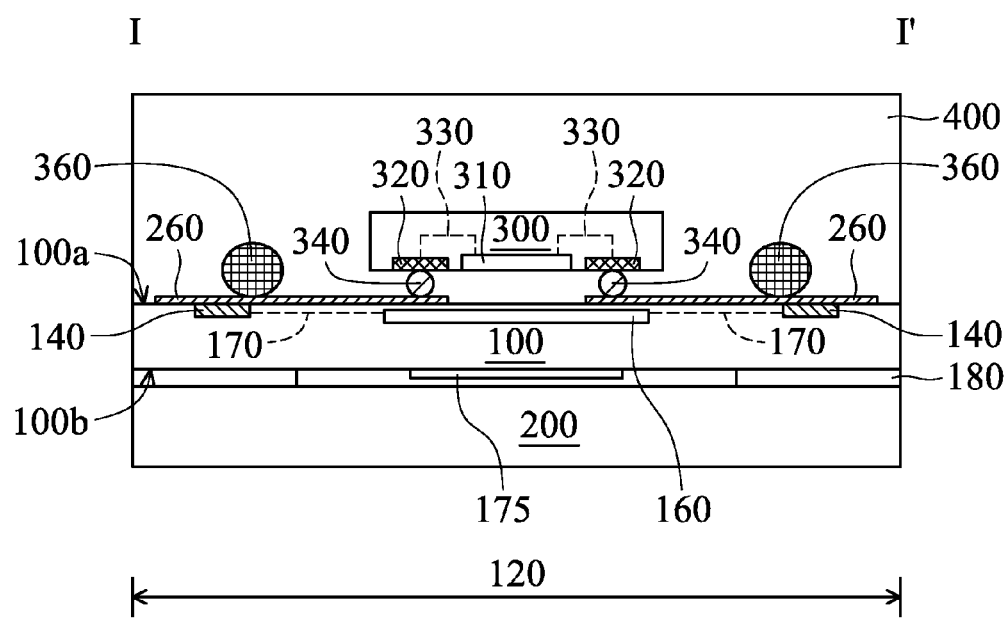
Figure 5E:
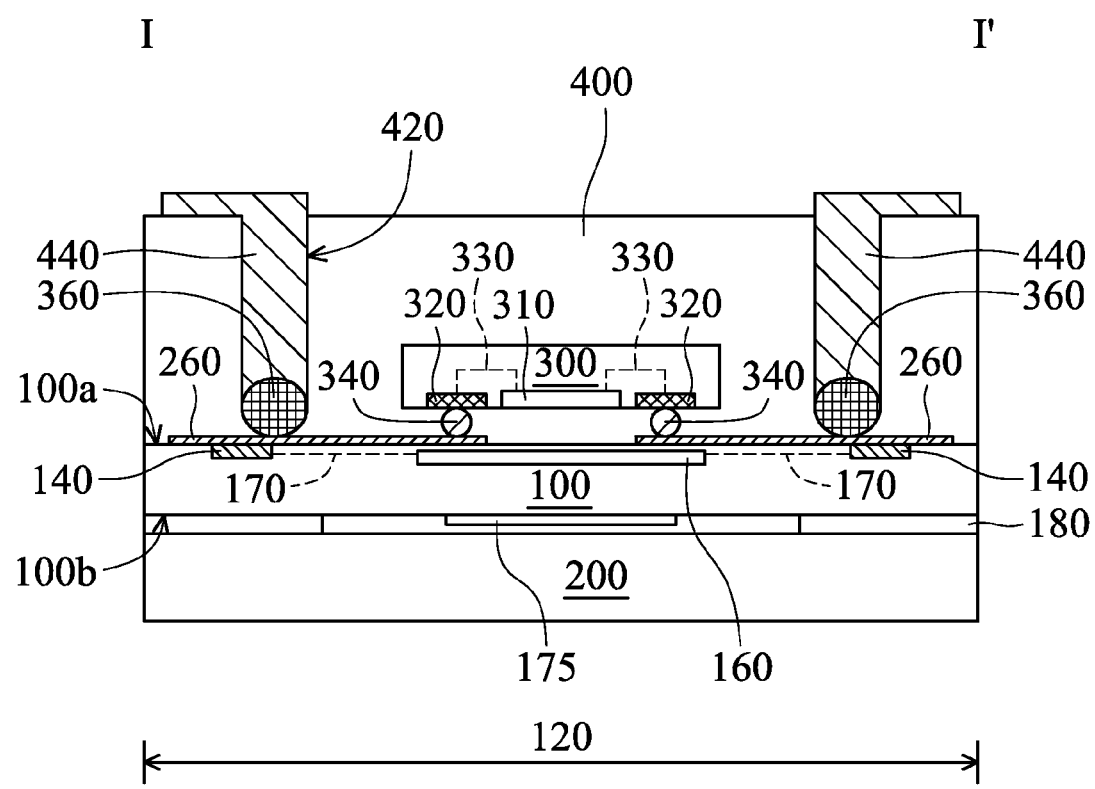
Figure 5F:
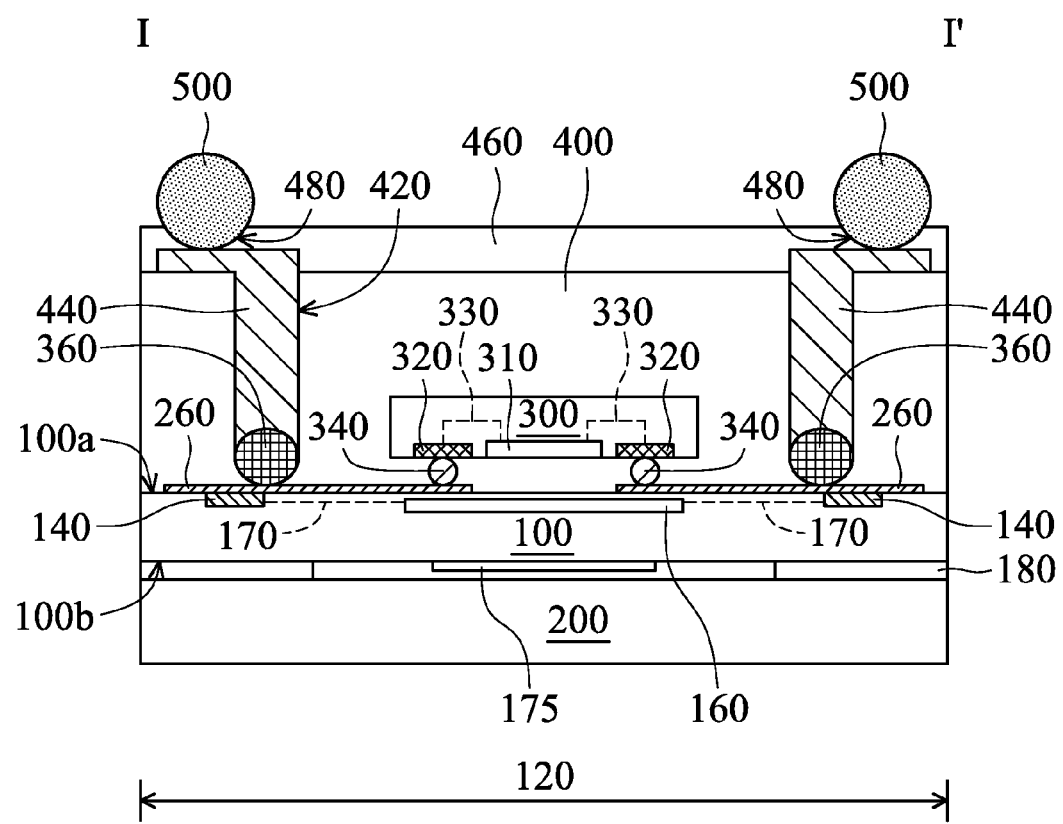
Figure 6:
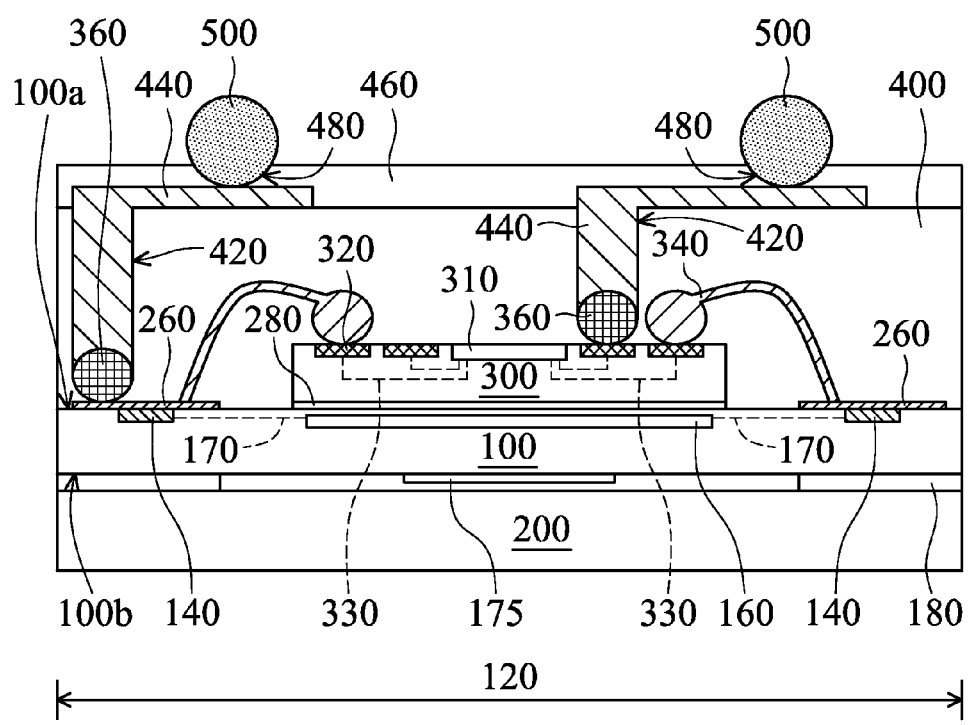
FIG. 6 is a cross-sectional view of yet another exemplary embodiment of a chip package according to the invention.

For example, the chip package structures shown in FIGS. 5F and 6 are similar to those shown in FIGS. 4A and 3A, respectively. The difference therebetween is that the chip packages shown in FIGS. 5F and 6 comprise a BSI image-sensing element while the chip packages shown in FIGS. 4A and 3A comprise an FSI image-sensing element. Elements in FIGS. 5F and 6 that are the same as those in FIGS. 4A and 3A are labeled with the same reference numbers as in FIGS. 4A and 3A and are not described again for brevity. In FIGS. 5F and 6, the first substrate 100 does not comprise first openings 220. The redistribution layer 260, the second substrate 300 and the insulating layer 400 are disposed on the first surface 100a of the first substrate 100. The optical element 175 is disposed on the second surface 100b of the first substrate 100 and the cover plate 200 is attached on the second surface 100b through the spacer layer 180.

According to the aforementioned embodiments, no matter whether the sensing device comprises an FSI or a BSI image-sensing element, one sensing device and one or more than one integrated circuit devices can be integrated in the same chip package. Therefore, the size of the electronic products made using the chip package can be significantly reduced.

An exemplary embodiment of a method for forming a chip package according to the invention is illustrated in FIGS. 1A to 1F, in which FIGS. 1A to 1F are cross-sectional views of an exemplary embodiment of a method for forming a chip package according to the invention.

Referring to FIG. 1A, a first substrate 100 is provided. The first substrate 100 has a first surface 100a and a second surface 100b opposite to the first surface 100a, and comprises a plurality of chip regions 120. In one embodiment, the first substrate 100 may be a silicon substrate or another semiconductor substrate. For example, the first substrate 100 may be a silicon wafer so as to facilitate the wafer-level packaging process.

In the embodiment, the first substrate 100 in each chip region 120 comprises one or more conducting pads 140. The conducting pads 140 may be adjacent to the first surface 100a. To simplify the diagram, only one chip region 120 of the first substrate 100 and only two conducting pads 140 therein are depicted herein as an example. In the embodiment, the conducting pad 140 may be a single conducting layer or comprise multiple conducting layers, and only a single conducting layer is depicted herein as an example.

In the embodiment, the first substrate 100 in each chip region 120 further comprises a sensing device 160. The sensing device 160 may be adjacent to the first surface 100a. In one embodiment, the sensing device 160 comprises an image-sensing element, such as a complementary metal-oxide-semiconductor image sensor (CIS) element. In another embodiment, the sensing device 160 is configured to sense biometrics, and may comprise a fingerprint-recognition element. In yet another embodiment, the sensing device 160 is configured to sense environmental characteristics, and may comprise a temperature-sensing element, a humidity-sensing element, a pressure-sensing element, a capacitance-sensing element, or another suitable sensing element. In one embodiment, the sensing element in the sensing device 160 may be electrically connected to the conducting pads 140 through an interconnection structure (not shown) in the first substrate 100. To simplify the diagram, dotted lines 170 are used herein to depict interconnection structures between the sensing device 160 and the conducting pads 140.

An optical element 175 may be formed on the first surface 100a of the first substrate 100 by coating, exposing and developing processes. The optical element 175 corresponds to the sensing device 160. The optical element 175 may comprise filters and micro-lenses or another suitable optical element. Next, a cover plate 200 is attached on the first surface 100a of the first substrate 100 through a spacer layer (or dam) 180. The spacer layer 180 covers the conducting pads 140 and exposes the sensing device 160 and the optical element 175. In an embodiment, the spacer layer 180 does not substantially absorb moisture. In an embodiment, the spacer layer 180 may be non-adhesive, and the cover plate 200 is attached on the first substrate 100 through the spacer layer 180 and additional adhesive layer. In another embodiment, the spacer layer 180 may be adhesive itself and may contact none of adhesion glue, thereby assuring that the spacer layer 180 will not move due to disposition of the adhesion glue. Furthermore, since the adhesion glue is not needed, the sensing device 160 can be prevented from being contaminated by the overflow of the adhesion glue. In the embodiment, the spacer layer 180 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), a photoresist material or another suitable insulating material. Moreover, the cover plate 200 may comprise glass, sapphire or another suitable protective material.

Referring to FIG. 1B, a thinning process, such as an etching process, a milling process, a mechanical grinding process or a chemical mechanical polishing process, using the cover plate 200 as a carrier substrate is performed on the second surface 100b of the first substrate 100. As a result, the thickness of the first substrate 100 is reduced.

Next, a plurality of first openings 220 may be formed in the first substrate 100 in each chip region 120 by lithography and etching processes (the etching process may comprise a dry etching process, a wet etching process, a plasma etching process, a reactive ion etching process, or another suitable process). The openings 220 extend from the second surface 100b of the first substrate 100 towards the first surface 100a, and expose the corresponding conducting pads 140 adjacent to the first surface 100a.

Referring to FIG. 1C, an insulating layer 240 may be conformally formed on the second surface 100b of the first substrate 100 by a deposition process (such as a coating process, a physical vapor deposition process, a chemical vapor deposition process or another suitable process). The insulating layer 240 extends into the first openings 220 in the first substrate 100. In the embodiment, the insulating layer 240 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Next, portions of the insulating layer 240 on the bottoms of the first openings 220 are removed by lithography and etching processes (the etching process may comprise a dry etching process, a wet etching process, a plasma etching process, a reactive ion etching process, or another suitable process) so as to expose the surfaces of the conducting pads 140. A patterned redistribution layer 260 is then formed on the insulating layer 240 by a deposition process (such as a coating process, a chemical vapor deposition process, a physical vapor deposition process, an electroplating process, an electroless plating process or another suitable process) and lithography and etching processes.

The redistribution layer 260 conformally extends to the sidewalls and the bottoms of the first openings 220. The redistribution layer 260 is electrically connected to the conducting pads 140 by directly or indirectly contacting the exposed conducting pads 140 through the first openings 220. The redistribution layer 260 is electrically isolated from the first substrate 100 by the insulating layer 240. As a result, the redistribution layer 260 in the first opening 220 is also referred to as a TSV. In one embodiment, the redistribution layer 260 may comprise copper, aluminum, gold, platinum, nickel, tin, a combination thereof, a conductive polymer material, a conductive ceramic material (such as indium tin oxide or indium zinc oxide), or another suitable conductive material.

In another embodiment, the first openings 220 may at least penetrate the conducting pads 140, such that the redistribution layer 260 may directly contact the inner of the conducting pads 140. This redistribution layer 260 electrically connected to the conducting pads 140 is referred to as a ring-contact.

Referring to FIG. 1D, a second substrate 300 may be attached onto the insulating layer 240 on the second surface 100b through an adhesive layer, such as adhesive glue, 280. In the embodiment, the second substrate 300 comprises an integrated circuit device 310. Moreover, the integrated circuit device 310 may comprise a signal processor, such as an image signal processor or another application-specific integrated circuit.

In the embodiment, the second substrate 300 may comprise one or more conducting pads 320. The conducting pads 320 may be adjacent to the upper surface of the second substrate 300. To simplify the diagram, only two conducting pads 320 in the second substrate 300 are depicted herein as an example. In one embodiment, the conducting pads 320 may be a single conducting layer or comprise multiple conducting layers. Only a single conducting layer is depicted herein as an example. In one embodiment, the conducting pads 320 may be electrically connected to the integrated circuit element in the integrated circuit device 310 through an interconnection structure (as shown by dotted lines 330) in the second substrate 300.

In the embodiment, the size of the first substrate 100 is greater than that of the second substrate 300. Moreover, when the size of the first substrate 100 is large enough, more than one second substrate 300, each having different integrated circuit functions, can be disposed on the second surface 100b of the first substrate 100. In the embodiment, the second substrate 300 completely vertically overlaps the sensing device 160 of the first substrate 100. In other embodiments, the second substrate 300 may partially vertically overlap the sensing device 160 of the first substrate 100 or may not vertically overlap the sensing device 160 of the first substrate 100.

Afterwards, a plurality of first conducting structures 340 may be formed on the corresponding conducting pads 320 and the corresponding redistribution layer 260 by a wire bonding process. A plurality of second conducting structures 360 may be formed on the corresponding redistribution layer 260 by a wire bonding process. In one embodiment, the first conducting structures 340 and the second conducting structures 360 are formed by the same wire bonding process. In other embodiments, the first conducting structures 340 and the second conducting structures 360 are individually formed by separated wire bonding processes.

The first conducting structures 340 are electrically connected to the sensing device 160 through the redistribution layer 260 and the conducting pads 140, and are electrically connected to the integrated circuit device 310 through the conducting pads 320. Therefore, the first conducting structures 340 electrically connect the sensing device 160 to the integrated circuit device 310. In one embodiment, each of the first conducting structures 340 is formed of a bonding ball on the conducting pad 320 and a wire extending from the bonding ball to the redistribution layer 260. Moreover, the first conducting structures 340 may comprise gold or another suitable conductive material.

The second conducting structures 360 are electrically connected to the corresponding conducting pads 140 through the redistribution layer 260. In one embodiment, each of the second conducting structures 360 is formed of a bonding ball located on the redistribution layer 260. The second conducting structures 360 may comprise gold or another suitable conductive material. In one embodiment, the material of the second conducting structures 360 is the same as the material of the first conducting structures 340.

Referring to FIG. 1E, an insulating layer 400 may be formed on the second surface 100b of the first substrate 100 by a molding process or a deposition process (such as a coating process, a physical vapor deposition process, a chemical vapor deposition process or another suitable process) to cover the second substrate 300, the insulating layer 240, the redistribution layer 260, and the first conducting structures 340. In the embodiment, the insulating layer 400 does not fill in the first openings 220 of the first substrate 100. In other embodiments, the insulating layer 400 may partially or fully fill the first openings 220 of the first substrate 100. In the embodiment, the insulating layer 400 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or another suitable insulating material.

Next, a plurality of holes 420 may be formed in the insulating layer 400 by a laser drilling process or lithography and etching processes (the etching process may comprise a dry etching process or a wet etching process). The holes 420 expose the corresponding second conducting structures 360. Accordingly, the second conducting structures 360 are located under the bottoms of the holes 420.

In these embodiments, the second conducting structures 360 on the redistribution layer 260 can be buffer layers during the formation of the holes 420, such as during a laser drilling process. As a result, the redistribution layer 260 is prevented from being damaged during the formation of the holes 420 thereby improving reliability or quality of the chip package. Moreover, since the second conducting structures 360 are formed on the redistribution layer 260, the depth of the holes 420 is reduced. Therefore, the aspect ratio (AR) of the holes 420 can be reduced thereby facilitating the formation of the holes 420.

In another embodiment, as shown in FIGS. 3A and 3B, after the wire bonding process is performed, one or more than one second conducting structures 360 may be located on the corresponding conducting pad 320 and other second conducting structures 360 may be located on the corresponding redistribution layer 260. Therefore, one or more than one second conducting structures 360 may be located on the second substrate 300 and vertically overlap the second substrate 300. The holes 420 are then formed in the insulating layer 400 to expose the corresponding second conducting structures 360, such that one or more than one holes 420 vertically overlap the corresponding conducting pad 320 and other holes 420 vertically overlap the corresponding redistribution layer 260.

In other embodiments, all of the second conducting structures 360 may be formed on the corresponding conducting pads 320. As a result, all of the second conducting structures 360 are located on the second substrate 300 and vertically overlap the second substrate 300. Moreover, all of the holes 420 vertically overlap the corresponding conducting pads 320.

Referring to FIG. 1F, a patterned metal layer 440 may be formed on the insulating layer 400 by a deposition process (such as a coating process, a chemical vapor deposition process, a physical vapor deposition process, an electroplating process, an electroless plating process or another suitable process) and lithography and etching processes. The patterned metal layer 440 fills the holes 420 in the insulating layer 400 so as to be electrically connected to the exposed second conducting structures 360 through the holes 420. In the embodiment, the metal layer 440 fully fills the holes 420 in the insulating layer 400. In other embodiments, the metal layer 440 may be conformally formed on the sidewalls and the bottoms of the holes 420 without fully filling the holes 420 in the insulating layer 400. In one embodiment, the metal layer 440 may comprise copper, aluminum, gold, platinum, nickel, tin, a combination thereof or another suitable conductive material.

Next, a passivation layer 460 may be formed on the metal layer 440 and the insulating layer 400 by a deposition process (such as a coating process, a physical vapor deposition process, a chemical vapor deposition process or another suitable process). Then, a plurality of second openings 480 may be formed in the passivation layer 460 in each chip region 120 by lithography and etching processes to expose portions of the metal layer 440 on the insulating layer 400. In one embodiment, the passivation layer 460 may comprise epoxy resin, solder mask, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates), or another suitable insulating material. In another embodiment, the passivation layer 460 may comprise a photoresist material, and the second openings 480 may be formed in the passivation layer 460 by a lithography process.

Afterwards, a plurality of third conducting structures 500 is formed in the corresponding second openings 480 of the passivation layer 460. The third conducting structures 500 directly contact the exposed metal layer 440 and are electrically connected to the metal layer 440. In the embodiment, each of the third conducting structures 500 is a bump, such as a bonding ball or a conducting pillar, or may be another suitable conducting structure. For example, solder may be formed in the second openings 480 of the passivation layer 460 by a plating process, a screen printing process or another suitable process. A reflow process is then performed and solder balls are formed to be the third conducting structures 500. In the embodiment, the third conducting structure 500 may comprise tin, lead, copper, gold, nickel, a combination thereof or another suitable conductive material.

In the embodiment, the second conducting structures 360 and the third conducting structures 500 are bonding balls and the size of the third conducting structures 500 is greater than the size of the second conducting structures 360. In one embodiment, the material of the third conducting structures 500 is different from the material of the second conducting structures 360. In one embodiment, the process for forming the third conducting structures 500 is different from the process for forming the second conducting structures 360. For example, the third conducting structures 500 are formed by a reflow process while the second conducting structures 360 are formed by a wire bonding process.

According to the embodiment, the second conducting structures 360 are formed of a material (such as gold) that is able to be eutectic with the material of the redistribution layer 260 (such as aluminum) and directly bonded thereto. Therefore, the second conducting structures 360 can be directly formed on the redistribution layer 260 without performing surface treatments on the redistribution layer 260 (The surface treatments may comprise forming an additional nickel layer between the redistribution layer 260 and the second conducting structures 360). Moreover, a wire bonding process, rather than a reflow process, is used to form the second conducting structures 360. As a result, the fabrication process is simplified.

In one embodiment, the third conducting structures 500 do not overlap the second substrate 300, as shown in FIG. 2. In another embodiment, the third conducting structures 500 may overlap the second substrate 300. In other embodiments, the second bumps 500 may be arranged in an array so as to provide stable bonding in the subsequent process. It should be realized that the positions of the first conducting structures 340, the second conducting structures 360, and the third conducting structures 500 are determined by design requirements and they are not limited thereto.

A protective layer (not shown), such as a tape, may be formed on the passivation layer 460 and the third conducting structures 500 to provide a flat surface and protect the third conducting structures 500. A dicing process using the protective layer as a support is then performed along scribe-lines (not shown) between the adjacent chip regions 120. The cover plate 200, the first substrate 100 and the insulating layer 400 are sequentially diced and the protective layer is removed to form a plurality of independent chip packages. In the embodiment, the cover plate 200 may be formed of a transparent material, such as glass, sapphire or another suitable transparent material thereby facilitating the dicing process along a direction from the cover plate 200 towards the first substrate 100. Therefore, the accuracy of alignment is enhanced.

In another embodiment, the cover plate 200 may be used to provide a flat surface and the dicing process may be directly performed along a direction from the first substrate 100 towards the cover plate 200 without forming the protective layer. In other embodiments, if the cover plate 200 is formed of an easily scratched material (such as glass, sapphire or another easily scratched material), a protective layer (not shown), such as a tape, may be formed on the cover plate 200. A dicing process using the protective layer as a support is then performed along scribe-lines (not shown) between the adjacent chip regions 120. The insulating layer 400, the first substrate 100 and the cover plate 200 are sequentially diced and the protective layer is removed to form a plurality of independent chip packages.

In the embodiment, a circuit board (not shown) may be further provided on the second surface 100b of the first substrate 100 of the independent chip package. The sensing device 160 in the first substrate 100 and the integrated circuit device 310 in the second substrate 300 may be electrically connected to the circuit board through the third conducting structures 500. In the aforementioned embodiments, the position and number of the second conducting structures 360 are determined by design requirements and they are not limited. For example, in one embodiment, all of the second conducting structures 360 are formed on the second substrate 300. Therefore, signals or other output circuits (such as power supply or ground) of the second substrate 300 are directly output through the second conducting structures 360. Signals or other output circuits (such as power supply or ground) of the first substrate 100 are output through the first conducting structures 340, the second substrate 300, and the second conducting structures 360. In another embodiment, all of the second conducting structures 360 are formed on the first substrate 100. Therefore, signals or other output circuits of the first substrate 100 and the second substrate 300 are output through the second conducting structures 360. In other embodiments, some of the second conducting structures 360 are formed on the first substrate 100 while other second conducting structures 360 are formed on the second substrate 300. Therefore, signals or other output circuits of the second substrate 300 are directly output through the second conducting structures 360 on the second substrate 300. Signals or other output circuits of the first substrate 100 can be optionally output through the first conducting structures 340, the second substrate 300, and the second conducting structures 360 on the second substrate 300 or directly through the second conducting structures 360 on the first substrate 100 without being output through the second substrate 300.

According to the aforementioned embodiments, TSVs (i.e. the redistribution layer 260) form the external electrical connection paths of the first substrate 100 having the sensing device 160. Accordingly, the second substrate 300 can be located on the second surface 100b of the first substrate 100, such that the sensing device 160 adjacent to the first surface 100a of the first substrate 100 can be prevented from being covered. Moreover, the sensing device 160 in the first substrate 100 can be electrically connected to the integrated circuit device 310 in the second substrate 300 through the first conducting structures formed by a wire bonding process. Therefore, according to the embodiments, one sensing device and one or more than one integrated circuit devices can be integrated in the same chip package. As a result, the size of the printed circuit board, which is subsequently bonded to the chip package, can be reduced, thereby further decreasing the size of the electronic products made using the chip package having a sensing function. In addition, forming chip packages by wafer-level packaging can produce massive chip packages, thereby significantly reducing the processing cost and time.

Another exemplary embodiment of a method for forming a chip package according to the invention is illustrated in FIGS. 5A to 5F, in which FIGS. 5A to 5F are cross-sectional views of another exemplary embodiment of a method for forming a chip package according to the invention. Elements in FIGS. 5A to 5F that are the same as those in FIGS. 1A to 1F are labeled with the same reference numbers as in FIGS. 1A to 1F and are not described again for brevity.

Referring to FIG. 5A, a first substrate 100 is provided. The first substrate 100 has a first surface 100a and a second surface 100b opposite to the first surface 100a. To simplify the diagram, only one chip region 120 of the first substrate 100 and only two conducting pads 140 therein are depicted herein as an example.

In the embodiment, the first substrate 100 in each chip region 120 further comprises a sensing device 160. The sensing device 160 may be adjacent to the first surface 100a. In one embodiment, the sensing element in the sensing device 160 may be electrically connected to the conducting pads 140 through an interconnection structure (not shown) in the first substrate 100. To simplify the diagram, dotted lines 170 are used herein to depict interconnection structures between the sensing device 160 and the conducting pads 140.

A patterned redistribution layer 260 is formed on the first surface 100a of the first substrate 100 by a deposition process (such as a coating process, a chemical vapor deposition process, a physical vapor deposition process, an electroplating process, an electroless plating process or another suitable process) and lithography and etching processes. The redistribution layer 260 extends on the sensing device 160. In the embodiment, the redistribution layer 260 is electrically connected to the conducting pads 140 directly or indirectly. The redistribution layer 260 is electrically isolated from the first substrate 100 by the dielectric material in the interconnection structure. In other embodiments, another dielectric material layer may be formed between the redistribution layer 260 and the interconnection structure.

Referring to FIG. 5B, a second substrate 300 may be attached onto the first substrate 100 through a plurality of first conducting structures 340. The first conducting structures 340 are formed between the redistribution layer 260 on the first surface 100a and conducting pads 320 of the second substrate 300. Namely, the conducting pads 320 face the first surface 100a of the first substrate 100. In the embodiment, the sensing device 160 and the integrated circuit device 310 are electrically connected to each other through the conducting pads 140, the redistribution layer 260, the first conducting structures 340, and the conducting pads 340. In the embodiment, each of the first conducting structures 340 is a bump, such as a bonding ball or a conducting pillar, or may be another suitable conducting structure. The first conducting structures 340 may comprise copper, aluminum, solder or another suitable conductive material. For example, a photoresist layer having a predetermined pattern of the first conducting structures 340 may be formed on the surface of the second substrate 300 adjacent to the conducting pads 320. The aforementioned conductive material is deposited in the pattern of the photoresist layer. The photoresist layer is then removed and the first conducting structures 340 are formed on the conducting pads 320 of the second substrate 300. Next, the second substrate 300 is bonded to the redistribution layer 260 by the first conducting structures 340.

In the embodiment, the size of the first substrate 100 is greater than that of the second substrate 300. Moreover, when the size of the first substrate 100 is large enough, more than one second substrate 300, each having different integrated circuit functions, can be disposed on the second surface 100b of the first substrate 100. In the embodiment, the second substrate 300 completely vertically overlaps the sensing device 160 of the first substrate 100. In other embodiments, the second substrate 300 may partially vertically overlap the sensing device 160 of the first substrate 100 or may not vertically overlap the sensing device 160 of the first substrate 100.

Afterwards, a plurality of second conducting structures 360 may be formed on the redistribution layer 260 by a wire bonding process. In one embodiment, the second conducting structures 360 are formed of bonding balls located on the redistribution layer 260. Moreover, the second conducting structures 360 may comprise gold or another suitable conductive material. In one embodiment, the material of the second conducting structures 360 is different from the material of the first conducting structures 340. In one embodiment, the size of the second conducting structures 360 is greater than the size of the first conducting structures 340. In one embodiment, the process for forming the second conducting structures 360 is different from the process for forming the first conducting structures 340. In the embodiment, signals or other output circuits (such as power supply or ground) of the first substrate 100 and the second substrate 300 are all output through the second conducting structures 360.

Referring to FIG. 5C, an insulating layer 400 may be formed on the first surface 100a of the first substrate 100 by a molding process or a deposition process (such as a coating process, a physical vapor deposition process, a chemical vapor deposition process or another suitable process) to cover the second substrate 300, the redistribution layer 260, and the second conducting structures 360. The insulating layer 400 surrounds the first conducting structures 340 between the first substrate 100 and the second substrate 300.

Next, a thinning process, such as an etching process, a milling process, a mechanical grinding process or a chemical mechanical polishing process, using the insulating layer 400 as a support is performed on the second surface 100b of the first substrate 100. As a result, the thickness of the first substrate 100 is reduced.

Referring to FIG. 5D, an optical element 175 may be formed on the second surface 100b of the first substrate 100 by coating, exposing and developing process. Next, a cover plate 200 is attached on the second surface 100b of the first substrate 100 through a spacer layer 180. The spacer layer 180 exposes the optical element 175 corresponding to the sensing device 160.

Referring to FIG. 5E, a plurality of holes 420 may be formed in the insulating layer 400 by a laser drilling process or lithography and etching processes (the etching process may comprise a dry etching process or a wet etching process). The holes 420 expose the corresponding second conducting structures 360. Accordingly, the second conducting structures 360 are located under the bottoms of the holes 420. Next, a patterned metal layer 440 may be formed on the insulating layer 400 by a deposition process (such as a coating process, a chemical vapor deposition process, a physical vapor deposition process, an electroplating process, an electroless plating process or another suitable process) and lithography and etching processes. The metal layer 440 fills the holes 420 in the insulating layer 400 so as to be electrically connected to the exposed second conducting structures 360 through the holes 420. In the embodiment, the metal layer 440 fully fills the holes 420 in the insulating layer 400. In other embodiments, the metal layer 440 may be conformally formed on the sidewalls and the bottoms of the holes 420 without fully filling the holes 420 in the insulating layer 400.

Referring to FIG. 5F, a passivation layer 460 may be formed on the metal layer 440 and the insulating layer 400 by a deposition process (such as a coating process, a physical vapor deposition process, a chemical vapor deposition process or another suitable process). Then, a plurality of second openings 480 may be formed in the passivation layer 460 in each chip region 120 by lithography and etching processes to expose portions of the metal layer 440 on the insulating layer 400.

Afterwards, a plurality of third conducting structures 500 is formed in the corresponding second openings 480 of the passivation layer 460. The third conducting structures 500 directly contact the exposed metal layer 440 and are electrically connected to the metal layer 440. In the embodiment, each of the third conducting structures 500 is a bump, such as a bonding ball or a conducting pillar, or may be another suitable conducting structure. For example, solder may be formed in the second openings 480 of the passivation layer 460 by a plating process, a screen printing process or another suitable process. A reflow process is then performed and solder balls are formed to be the third conducting structures 500. In the embodiment, the third conducting structure 500 may comprise tin, lead, copper, gold, nickel, a combination thereof or another suitable conductive material.

In one embodiment, the first conducting structures 340, the second conducting structures 360 and the third conducting structures 500 are balls. The size of the second conducting structures 360 is less than the size of the third conducting structures 500 and is greater than the size of the first conducting structures 340. In one embodiment, the material of the third conducting structures 500 is different from the material of the second conducting structures 360. In one embodiment, the process for forming the third conducting structures 500 is different from the process for forming the second conducting structures 360. For example, the third conducting structures 500 are formed by a reflow process while the second conducting structures 360 are formed by a wire bonding process.

A dicing process is then performed along scribe-lines (not shown) between the adjacent chip regions 120. The cover plate 200, the first substrate 100 and the insulating layer 400 are diced to form a plurality of independent chip packages. In the embodiment, a circuit board (not shown) may be further provided on the first surface 100a of the first substrate 100 of the independent chip package. The sensing device 160 in the first substrate 100 and the integrated circuit device 310 in the second substrate 300 may be electrically connected to the circuit board through the third conducting structures 500.

In addition, the embodiments of FIGS. 1A to 1F and FIGS. 5A to 5F can be combined. For example, referring to FIG. 6, a patterned redistribution layer 260 may be formed on the first surface 100a of the first substrate 100 by the same or similar steps shown in FIG. 5A. This redistribution layer 260 does not extend on the sensing device 160.

Next, a second substrate 300 may be attached onto the first surface 100a of the first substrate 100 through an adhesive layer 280 by the same or similar steps shown in FIG. 1D. A wire bonding process is performed, such that first conducting structures 340 are formed on the corresponding conducting pads 320 and redistribution layer 260, one or more than one second conducting structures 360 are formed on the corresponding conducting pads 320, and other second conducting structures 360 are formed on the corresponding redistribution layer 260.

Next, an insulating layer 400 may be formed on the first surface 100a of the first substrate 100 by the same or similar steps shown in FIG. 5C. The insulating layer 400 covers the second substrate 300, the redistribution layer 260, the first conducting structures 340 and the second conducting structures 360. Afterwards, a thinning process using the insulating layer 400 as a support is performed on the second surface 100b of the first substrate 100.

An optical element 175 may be formed on the second surface 100b of the thinned first substrate 100 by the same or similar steps shown in FIG. 5D. A cover plate 200 is then attached on the second surface 100b of the first substrate 100 through a spacer layer 180.

Afterwards, a plurality of holes 420 may be formed in the insulating layer 400 by the same or similar steps shown in FIG. 1E or FIG. 5E so as to expose the corresponding second conducting structures 360.

In these embodiments, the second conducting structures 360 on the conducting pads 320 and the redistribution layer 260 can be buffer layers during the formation of the holes 420, such as during a laser drilling process. Moreover, since one or more than one second conducting structures 360 are formed on the corresponding conducting pads 320, rather than the redistribution layer 260, the aspect ratio of the holes 420 can be reduced thereby facilitating the formation of the holes 420.

In other embodiments, all of the second conducting structures 360 may be formed on the corresponding conducting pads 320 or redistribution layer 260. All of the subsequently formed holes 420 vertically overlap the corresponding conducting pads 320 or redistribution layer 260.

Next, a patterned metal layer 440 may be formed on the insulating layer 400 by similar steps shown in FIG. 1F or FIG. 5E. The metal layer 440 fills the holes 420 in the insulating layer 400. A passivation layer 460 may be formed on the metal layer 440 and the insulating layer 400 and a plurality of second openings 480 may be formed in the passivation layer 460 by similar steps shown in FIG. 1F or FIG. 5F. Afterwards, third conducting structures 500 are correspondingly formed in the second openings 480 of the passivation layer 460. A dicing process is then performed along scribe-lines (not shown) between the adjacent chip regions 120 to form a plurality of independent chip packages. Therefore, the chip package shown in FIG. 6 is fabricated.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a first substrate comprising a sensing device, wherein the first substrate has a first opening, a first surface and a second surface opposite to the first surface;
   a second substrate attached onto the first substrate, wherein the second substrate comprises an integrated circuit device;
   a first conducting structure electrically connected to the sensing device and the integrated circuit device through a redistribution layer disposed on the first substrate;
   an insulating layer covering the first substrate, the second substrate and the redistribution layer, wherein the insulating layer has a hole therein; and a second conducting structure disposed under a bottom of the hole, and the second conducting structure is on the redistribution layer and in direct contact with the redistribution layer, wherein the redistribution layer conformally extends to sidewalls and a bottom of the first opening, and the first conducting structure and the second conducting structure are on the second surface and on opposite sides of the first opening.

2. The chip package as claimed in claim 1, wherein a size of the first substrate is greater than that of the second substrate.

3. The chip package as claimed in claim 1, wherein the sensing device is adjacent to the first surface, and the second substrate is attached to the second surface, and wherein the first substrate further comprises:
a conducting pad adjacent to the first surface, wherein the first opening extends from the second surface toward the first surface and exposes the conducting pad.

4. The chip package as claimed in claim 3, wherein the redistribution layer is disposed on the second surface of the first substrate and is electrically connected to the exposed conducting pad through the first opening.

5. The chip package as claimed in claim 4, wherein a material of the second conducting structure is the same as that of the first conducting structure.

6. The chip package as claimed in claim 1, further comprising:
a metal layer disposed on the insulating layer and electrically connected to the second conducting structure through the hole; and
a third conducting structure electrically connected to the metal layer on the insulating layer.

7. The chip package as claimed in claim 6, wherein a material of the third conducting structure is different from that of the second conducting structure.

8. The chip package as claimed in claim 6, wherein the second conducting structure and the third conducting structure are bonding balls.

9. The chip package as claimed in claim 8, wherein a size of the third conducting structure is greater than that of the second conducting structure.

10. The chip package as claimed in claim 1, wherein the integrated circuit device comprises a signal processor.

11. The chip package as claimed in claim 1, wherein the first conducting structure is disposed on the second substrate and extends onto the redistribution layer, and wherein the second conducting structure is disposed on the first substrate.

12. The chip package as claimed in claim 1, wherein the first conducting structure is disposed on the second substrate and extends onto the redistribution layer, and wherein a fourth conducting structure is disposed on the second substrate.

13. The chip package as claimed in claim 1, wherein the first conducting structure is disposed between the first substrate and the second substrate, and wherein the second conducting structure is disposed on the first substrate.

14. The chip package as claimed in claim 1, wherein the sensing device is adjacent to the first surface, and the second substrate is attached to the second surface, and wherein the first substrate further comprises a conducting pad adjacent to the first surface.

15. The chip package as claimed in claim 14, wherein the redistribution layer is disposed on the second surface of the first substrate and is electrically connected to the conducting pad.

16. The chip package as claimed in claim 1, wherein a material of the second conducting structure is different from that of the first conducting structure.

17. The chip package as claimed in claim 16, wherein a size of the second conducting structure is greater than that of the first conducting structure.

18. A method for forming a chip package, comprising:
providing a first substrate, wherein the first substrate comprises a sensing device and has a first surface and a second surface opposite to the first surface;
attaching a second substrate onto the first substrate, wherein the second substrate comprises an integrated circuit device;
forming a first opening in the first substrate;
forming a first conducting structure electrically connected to the sensing device and the integrated circuit device through a redistribution layer located on the first substrate, wherein the redistribution layer conformally extends to sidewalls and a bottom of the first opening; and
forming a second conducting structure and an insulating layer, wherein the insulating layer covers the first substrate, the second substrate and the redistribution layer, and the insulating layer has a hole therein, and wherein the second conducting structure is located under a bottom of the hole, and the second conducting structure is on the redistribution layer and in direct contact with the redistribution layer, and the first conducting structure and the second conducting structure are on the second surface and on opposite sides of the first opening.

19. The method as claimed in claim 18, wherein a size of the first substrate is greater than that of the second substrate.

20. The method as claimed in claim 18, wherein the sensing device is adjacent to the first surface, and the second substrate is attached to the second surface, and wherein the first substrate further comprises a conducting pad adjacent to the first surface, and wherein the first opening extends from the second surface toward the first surface and exposes the conducting pad, and wherein the redistribution layer is located on the second surface of the first substrate and is electrically connected to the exposed conducting pad through the first opening.

21. The method as claimed in claim 20, wherein a material of the second conducting structure is the same as that of the first conducting structure.

22. The method as claimed in claim 18, further comprising:
forming a metal layer on the insulating layer, wherein the metal layer is electrically connected to the second conducting structure through the hole; and
forming a third conducting structure on the metal layer on the insulating layer.

23. The method as claimed in claim 22, wherein a material of the third conducting structure is different from that of the second conducting structure.

24. The method as claimed in claim 22, wherein the second conducting structure and the third conducting structure are bonding balls.

25. The method as claimed in claim 24, wherein a size of the third conducting structure is greater than that of the second conducting structure.

26. The method as claimed in claim 22, wherein a process for forming the third conducting structure is different from that for forming the second conducting structure.

27. The method as claimed in claim 18, wherein the integrated circuit device comprises a signal processor.

28. The method as claimed in claim 18, wherein the first conducting structure is formed on the second substrate and extends onto the redistribution layer, and wherein the second conducting structure is formed on the first substrate.

29. The method as claimed in claim 18, wherein the first conducting structure is formed on the second substrate and extends onto the redistribution layer, and wherein a fourth conducting structure is formed on the second substrate.

30. The method as claimed in claim 18, wherein the first conducting structure is formed between the first substrate and the second substrate, and wherein the second conducting structure is formed on the first substrate.

31. The method as claimed in claim 18, wherein the sensing device is adjacent to the first surface, and the second substrate is attached to the second surface, and wherein the first substrate further comprises a conducting pad adjacent to the first surface, and the redistribution layer is located on the second surface of the first substrate and is electrically connected to the conducting pad.

32. The method as claimed in claim 18, wherein a material of the second conducting structure is different from that of the first conducting structure.

33. The method as claimed in claim 32, wherein a size of the second conducting structure is greater than that of the first conducting structure.

34. The method as claimed in claim 18, wherein a process for forming the second conducting structure is different from that for forming the first conducting structure.

\* \* \* \* \*